United States Patent [19]

Motoda et al.

[11] Patent Number: 5,694,410
[45] Date of Patent: Dec. 2, 1997

[54] SEMICONDUCTOR LASER DEVICE

[75] Inventors: Takashi Motoda; Kenichi Ono, both of Tokyo, Japan

[73] Assignee: Mitsubishi Denki Kabushiki Kaisha, Tokyo, Japan

[21] Appl. No.: 703,987

[22] Filed: Aug. 28, 1996

[30] Foreign Application Priority Data

Mar. 1, 1996 [JP] Japan .............................. HEI.8-044713

[51] Int. Cl.$^6$ ...................................................... H01S 3/19
[52] U.S. Cl. ........................................ 372/46; 372/45
[58] Field of Search ........................................ 372/45, 46

[56] References Cited

U.S. PATENT DOCUMENTS 5,394,424  2/1995  Ijichi et al. ................................ 372/46

FOREIGN PATENT DOCUMENTS

4234184  8/1992  Japan .
5175601  7/1993  Japan .
5343738  12/1993  Japan .
6224516  8/1994  Japan .

*Primary Examiner*—James W. Davie
*Attorney, Agent, or Firm*—Leydig, Voit & Mayer, Ltd.

[57] ABSTRACT

In a semiconductor laser device including a strained multi-quantum well active layer having a plurality of well layers and a plurality of barrier layers, alternatingly laminated, each well layer includes a main region having a strain while each barrier layer includes a main region having a strain different from the strain of the well layer. Either or both of the well layers and the barrier layers has transition regions at both sides of the main region. The transition regions have a strain that gradually varies from the strain of the main region to the strain of the main regions of adjacent layers toward interfaces between the well and barrier layers. The difference in strains between adjacent layers at the interfaces is smaller than the difference in strains between the main regions of adjacent layers. Therefore, lattice defects, such as dislocations, at the interfaces of the well layer and the barrier layers are reduced, so that the strained multiquantum active layer is grown with improved surface morphology. As a result, the optical characteristics of the strained multiquantum active layer are improved, and the laser characteristics of the semiconductor laser including this active layer are improved.

8 Claims, 9 Drawing Sheets

Prior Art

Fig.17

SEMICONDUCTOR LASER DEVICE

FIELD OF THE INVENTION

The present invention relates to a semiconductor laser device including a strained multiquantum well (hereinafter referred to as MQW) active layer.

BACKGROUND OF THE INVENTION

In order to reduce the oscillating wavelength of a laser diode fabricated on a GaAs substrate and produce red light having a wavelength from 685 nm to 635–650 nm, a strained MQW structure, i.e., an MQW structure in which the In composition of GaInP well layers is reduced, is employed as an active layer of the laser diode. When the In composition of the GaInP well layers is reduced, the lattice constant of the GaInP well layers becomes smaller than the lattice constant of the GaAs substrate, whereby a tensile strain is produced in the active layer.

When the lattice constant of the strained MQW active layer does not match the lattice constant of the substrate as mentioned above, with an increase in the number of well layers and barrier layers, the well layers and the barrier layers pull each other to balance the lattice constant. Generally, this balanced lattice constant is called a free-standing lattice constant. Therefore, the MQW active layer is evenly strained, and defects, such as dislocations, occur when the thickness of the strained MQW active layer exceeds a critical thickness. In order to avoid the defects, the strained MQW active layer must not exceed the critical thickness. Since the strained MQW active layer has such a critical thickness, there is a limitation in increasing the number of well layers and barrier layers in the MQW structure.

This problem is solved in a strained MQW semiconductor laser disclosed in Japanese Published Patent Application No. Hei. 6-224516, wherein a strained MQW active layer comprises well layers and barrier layers having opposite strains and alternatingly laminated to match the free-standing lattice constant of the active layer with the lattice constant of the substrate.

Figure 13:
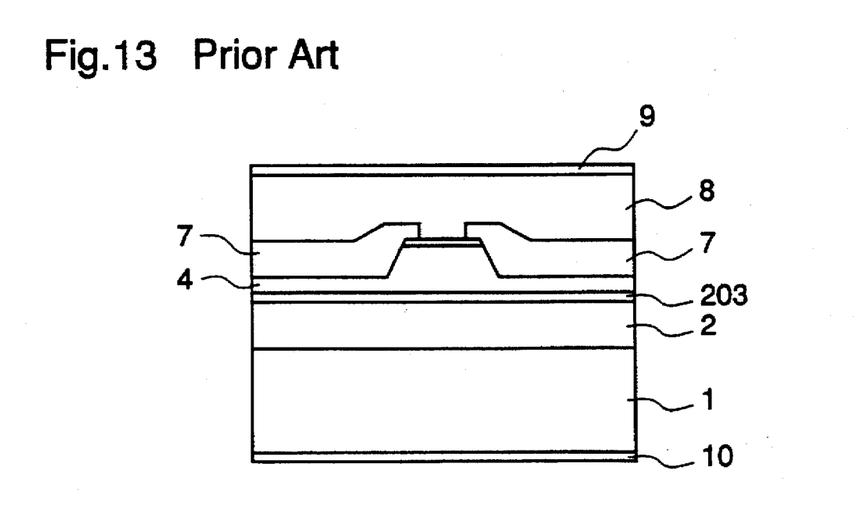
FIG. 13 is a cross-sectional view illustrating a semiconductor laser device according to the prior art.

The strained MQW semiconductor laser disclosed in this publication is shown in FIG. 13. This semiconductor laser is fabricated in the following process. Initially, an n type AlGaInP cladding layer 2, a strained MQW active layer 203, a p type AlGaInP cladding layer 4, and a p type GaAs cap layer 6 are successively grown on an n type GaAs substrate 1, and portions of the cap layer 6 and the cladding layer 4 are etched and removed to form a stripe-shaped ridge. Thereafter, the ridge is buried with n type GaAs current blocking layers 7, and a p type GaAs contact layer 8 is grown over the entire surface. Finally, an anode electrode 9 and a cathode electrode 10 are fabricated on the contact layer 8 and the substrate 1, respectively.

Figure 14:
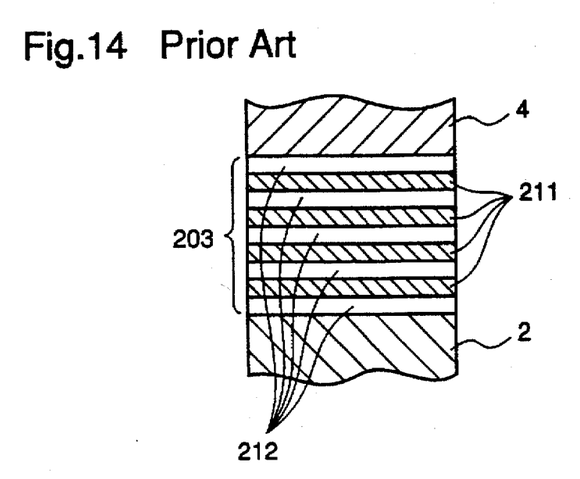
FIG. 14 is a cross-sectional view illustrating a strained MQW active layer included in the semiconductor laser device shown in FIG. 13.
Figure 15:
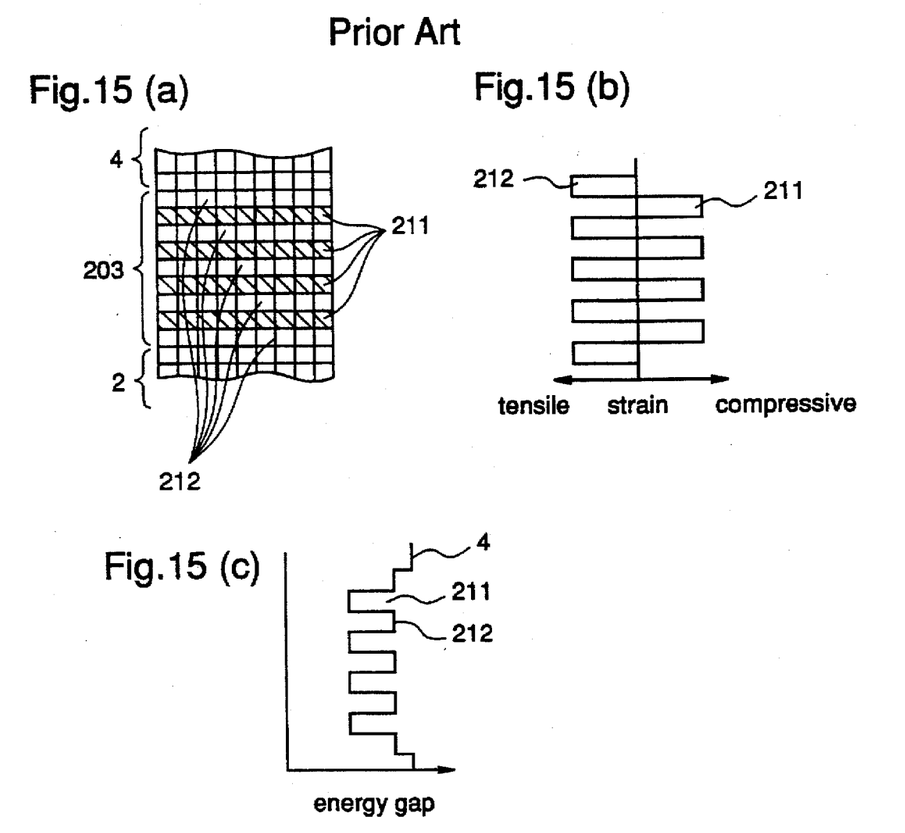
FIGS. 15(a), 15(b), and 15(c) are diagrams illustrating a lattice structure, strains, and an energy band structure, respectively, of the strained MQW active layer shown in FIG. 14.

FIG. 14 is a cross-sectional view showing a part of the semiconductor laser shown in FIG. 13, including the n type cladding layer 2, the strained MQW active layer 3, and the p type cladding layer 4. FIG. 15(a) shows a lattice structure of this part, FIG. 15(b) shows strains applied to this part, and FIG. 15(c) shows an energy band structure of this part.

As shown in FIG. 14, the active layer 203 comprises, alternatingly laminated, 5 nm thick $Ga_{0.44}In_{0.56}P$ well layers 211 and 5 nm thick $(Al_{0.45}Ga_{0.55})_{0.57}In_{0.43}P$ barrier layers 212. In this case, each well layer 211 has a compressive strain of 0.5% and each barrier layer 212 has a tensile strain of 0.5% because of the lattice mismatch between these layers and the GaAs substrate 1. When the barrier layer 212 and the well layer 211 are strained in opposite directions as described above, the free-standing lattice constant of the MQW active layer 203 can be almost matched with the lattice constant of the GaAs substrate 1.

In this publication, it is described that a high quality crystalline MQW active layer having no risk of dislocations is obtained even when the strained MQW structure is epitaxially grown with an infinite of periodic layer structures.

However, when a strained MQW layer is grown so that well layers are tensively strained and barrier layers are compressively strained to reduce the tensile strains in the well layers, the surface morphology of the grown layer is degraded, whereby the optical characteristics are degraded.

Figure 16:
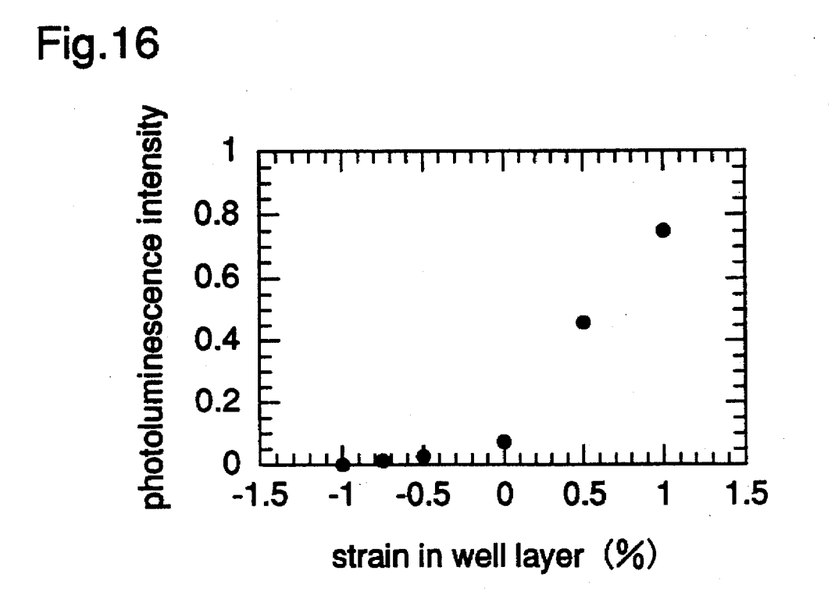
FIG. 16 is a diagram illustrating the relationship between the photoluminescence intensity and the strain in well layers in a strained MQW layer in which barrier layers have no strain.
Figure 17:
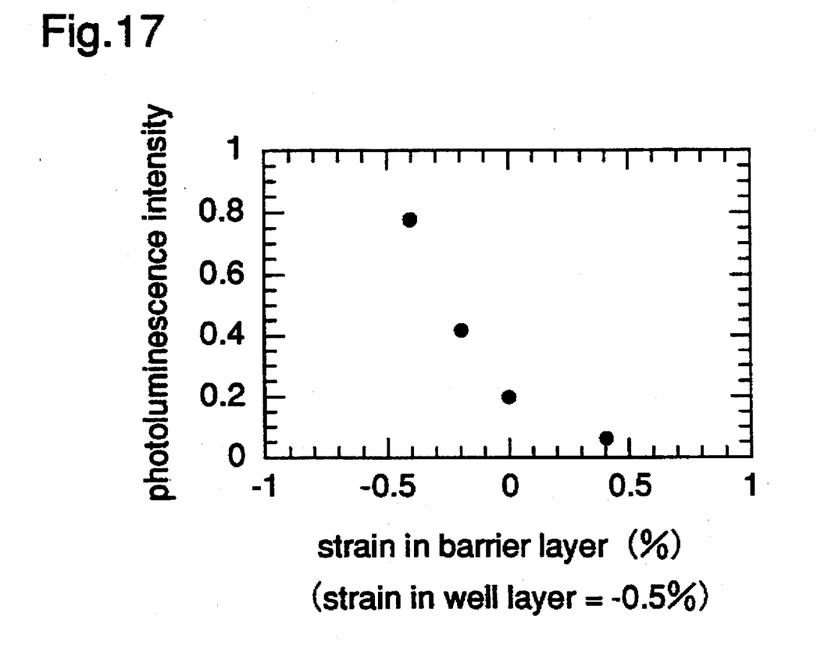
FIG. 17 is a diagram illustrating the relationship between the photoluminescence intensity and the strain in barrier layers in a strained MQW layer in which well layers have strains of −0.5%.

As shown in FIG. 16, when the barrier layer is not strained, the photoluminescence intensity of the MQW layer decreases with an increase in the tensile strain in the well layer. On the other hand, as shown in FIG. 17, when the tensile strain in the well layer is fixed at 0.5%, the photoluminescence intensity of the MQW layer decreases with a decrease in the tensile strain in the barrier layer. When the MQW layer is grown so that a compressive strain of 0.4% is applied to the barrier layers to reduce the tensile strains in the well layers, the surface morphology of the grown layer is degraded, and the optical characteristics are further degraded as shown in FIG. 17. The reason for the degradation of the surface morphology is as follows. In a strained MQW structure in which well layers are tensively strained and barrier layers are compressively strained to reduce the tensile strains in the well layers, a difference in lattice constants, i.e., difference in strains, between the well layer and the barrier layer increases at the interface of these layers, and lattice defects, such as dislocations, easily occur at the interface when the strained MQW layer is grown.

On the other hand, as can be seen from FIG. 17, when the well layer is tensively strained, the photoluminescence intensity of the strained MQW layer increases and the optical characteristics are improved when the barrier layer is also tensively strained, although the photoluminescence intensity decreases when the barrier layer is compressively strained. The reason for the increase in the photoluminescence intensity is as follows. That is, when both the well layer and the barrier layer are tensively strained, the difference in strains, i.e., lattice constants, between the well layer and the barrier layer is reduced at the interface of these layers, whereby undesired lattice defects, such as dislocations, are suppressed at the interface.

In this case, however, since both the well layer and the barrier layer are tensively strained, the MQW active layer comprising these layers is tensively strained throughout, and dislocations occur when the thickness of this active layer exceeds a critical thickness. In order to avoid dislocations, the strained MQW active layer must be produced so that it does not exceed a critical thickness, so that there is a limitation in the number of the alternatingly laminated well layers and barrier layers. Further, even though both the barrier layer and the well layer are tensively strained, when the values of the tensile strains are different between the well layer and the barrier layer, lattice defects, such as dislocations, occur at the interface between the well layer and the barrier layer due to the difference in the tensile strains, whereby the optical characteristics of the strained MQW layer are degraded.

SUMMARY OF THE INVENTION

It is an object of the present invention to provide a semiconductor laser device including a strained MQW active layer with reduced lattice defects, such as dislocations, at the interface between the well layer and the barrier layer due to a difference in lattice constants, i.e., strains, between these layers.

Other objects and advantages of the invention will become apparent from the detailed description that follows. The detailed description and specific embodiments described are provided only for illustration since various additions and modifications within the scope of the invention will be apparent to those of skill in the art from the detailed description.

According to an aspect of the present invention, in a semiconductor laser device including a strained multiquantum well active layer in which a plurality of well layers and a plurality of barrier layers are alternatingly laminated and each well layer includes a main region having a strain while each barrier layer includes a main region having a strain different from the strain of the well layer, at least one of the well layers and the barrier layers has transition regions at both sides of the main region, which transition regions have a strain that gradually varies from the strain of the main region of this layer to the strain of the main regions of adjacent layers toward interfaces between this layer and the adjacent layers, and a difference in strains between this layer and the adjacent layers at the interfaces of these layers is smaller than a difference in strains between the main region of this layer and the main regions of the adjacent layers. Therefore, lattice defects, such as dislocations, at the interface of the well layer and the barrier layer are reduced, so that the strain multiquantum active layer is grown with improved surface morphology. As a result, the optical characteristics of the strained multiquantum active layer are improved, and the laser characteristics of the semiconductor laser including this active layer are improved.

DETAILED DESCRIPTION OF THE PREFERRED EMBODIMENTS

[Embodiment 1]

A description is given of a semiconductor laser device according to a first embodiment of the present invention. A semiconductor laser device according to this first embodiment includes a strained MQW active layer comprising, alternatingly laminated, tensively strained well layers and compressively strained barrier layers, and each of these layers has transition regions wherein the strain gradually varies toward the interfaces between the well layers and the barrier layers to make the strain of the well layers and the strain of the barrier layers equal to each other at the interfaces.

Figure 1:
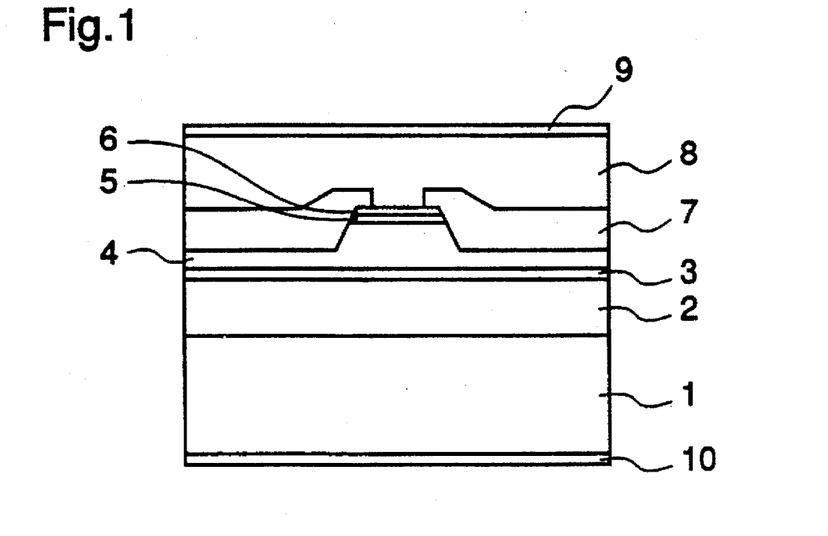
FIG. 1 is a cross-sectional view illustrating a semiconductor laser device in accordance with a first embodiment of the present invention.
Figure 2:
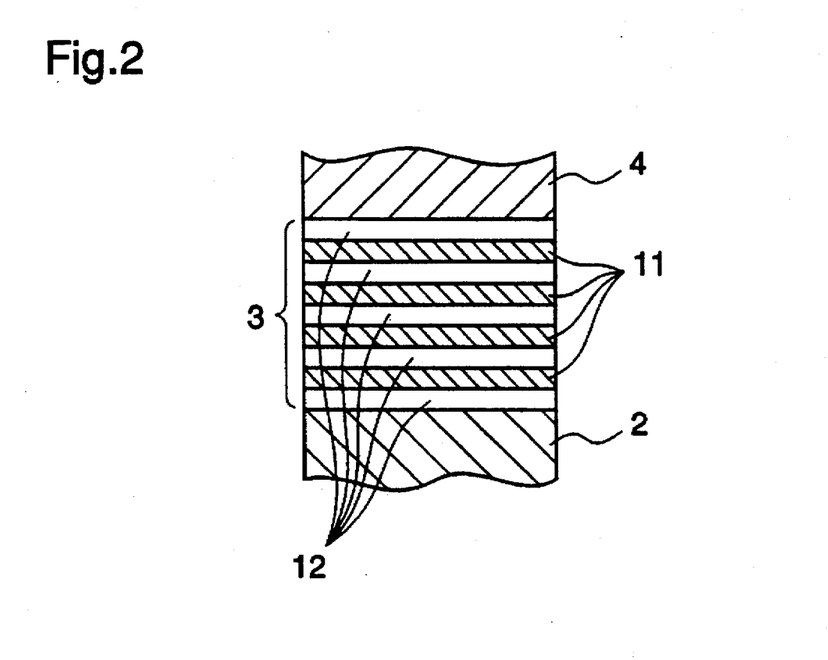
FIG. 2 is a cross-sectional view illustrating a strained MQW active layer included in the semiconductor laser device shown in FIG. 1.

FIG. 1 is a cross-sectional view illustrating a semiconductor laser device according to the first embodiment of the invention. FIG. 2 is a cross-sectional view illustrating a strained MQW active layer included in the laser device. The semiconductor laser device is fabricated in the following process. Initially, an n type AlGaInP cladding layer 2, a strained MQW active layer 3, a p type AlGaInP cladding layer 4, a p type GaInP band discontinuity reduction (hereinafter referred to as BDR) layer 5, and a p type GaAs cap layer 6 are successively grown on an n type GaAs substrate 1. Preferably, these layers are grown by MOCVD (Metal Organic Chemical Vapor Deposition). Then, the cap layer 6, the BDR layer 5, and the cladding layer 4 are etched to form a stripe-shaped mesa. Thereafter, the mesa is buried with n type GaAs current blocking layers 7, and a p type GaAs contact layer 8 is grown on the entire surface. Finally, an anode electrode 9 and a cathode electrode 10 are fabricated on the contact layer 8 and the substrate 1, respectively.

As shown in FIG. 2, the active layer 3 has a strained MQW structure comprising, alternatingly laminated, four well layers 11 and five barrier layers 12.

Figure 3:
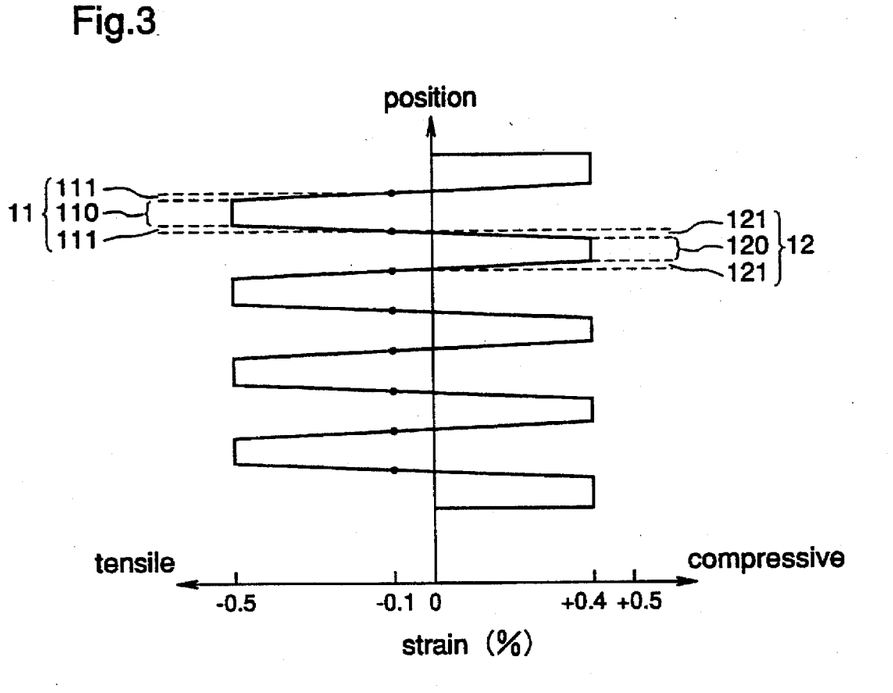
FIG. 3 is a diagram illustrating strains in the strained MQW active layer shown in FIG. 2.

FIG. 3 shows strains in the strained MQW active layer 3. Each well layer 11 is 5 nm thick and includes a main region 110 comprising $Ga_{0.56}In_{0.44}P$. Each barrier layer 12 is 5 nm thick and includes a main region 120 comprising $(Al_{0.5}Ga_{0.5})_{0.452}In_{0.548}P$. The main region 110 of the well layer 11 has a tensile strain of 0.5%, i.e., −0.5% with respect to the GaAs substrate 1, and the main region 120 of the barrier layer 12 has a compressive strain of 0.4%, i.e., +0.4% with respect to the GaAs substrate 1, because of the lattice mismatch with the GaAs substrate 1. That is, the difference in strains between the main region 110 of the well layer 11 and the main region 120 of the barrier layer 12 is 0.9%. Hereinafter, a compressive strain is represented by "+" and a tensile strain is represented by "−".

Further, each well layer 11 has transition regions 111 comprising GaInP several angstroms thick at both sides of the main region 110 toward the interfaces between this layer and the adjacent barrier layers 12. In each transition region 111, the composition Of GaInP gradually varies from $Ga_{0.56}In_{0.44}P$ to $Ga_{0.512}In_{0.488}P$ so that the strain gradually varies from −0.5% to −0.1% from the main region 110 toward the interface.

On the other hand, each barrier layer 12 has transition regions 121 comprising AlGaInP several angstroms thick at both sides of the main region 120 toward the interfaces between this layer and the adjacent well layers 11. In each transition region 121, the composition of AlGaInP gradually varies from $(Al_{0.5}Ga_{0.5})_{0.452}In_{0.548}P$ to $(Al_{0.5}Ga_{0.5})_{0.512}In_{0.488}P$ so that the strain gradually varies from +0.4% to −0.1% from the main region 120 toward the interface.

In the strained MQW active layer 3, since the well layer 11 and the barrier layer 12 have the transition region 111 and the transition region 121, respectively, both the well layer and the barrier layer have the same strain, i.e., −0.1%, at the interface between these layers. That is, there is no difference in strains between the well layer and the barrier layer at the interface.

According to this first embodiment of the invention, since there is no difference in strains, i.e., lattice constants, between the well layer 11 and the barrier layer 12 at the interface of these layers, lattice defects, such as dislocations, at the interface are significantly reduced. So, the strained MQW active layer is grown with improved surface morphology, whereby the optical characteristics of the active layer are significantly improved. Further, the laser characteristics of the semiconductor laser including this strained MQW active layer are improved.

In the strained MQW active layer 3, the main region 110 of the well layer 11 has a tensile strain of 0.5% and the main region 120 of the barrier layer 12 has a compressive strain of 0.4%. However, the values of the strains are not restricted thereto. Even when the main region of the well layer and the main region of the barrier layer have strains different from those mentioned above, the same effects as described above are obtained by providing transition regions similar to the transition regions 111 and 121 at both sides of the main regions. The effects are considerable when a difference in strains between the main region of the well layer and the main region of the barrier layer is large.

Further, in the strained MQW active layer 3, the difference in strains between the well layer 11 and the barrier 12 at the interface of these layers is zero. However, there may be a little difference in strains between these layers at the interface. For example, in a strained MQW active layer shown in FIG. 4, each well layer 11 has transition regions 111 at both sides of a main region 110 and, in the transition regions 111, the strain gradually varies from −0.5% to −0.2% from the main region 110 toward the interfaces between this well layer 11 and adjacent barrier layers 12. On the other hand, each barrier layer 12 has transition regions 121 at both sides of a main region 120 and, in the transition regions 121, the strain gradually varies from +0.4% to 0% from the main region 120 toward the interfaces between this barrier layer 12 and adjacent well layers 11. In this strained MQW structure, the difference in strains between the well layer 11 and the barrier layer 12 at the interface of these layers is 0.2%. Also in this case, the difference in strains between the well layer and the barrier layer at the interface, i.e., 0.2%, is smaller than the difference in strains between the main region 110 of the well layer 11 and the main region 120 of the barrier layer 12, i.e., 0.9%, so that lattice defects, such as dislocations, at the interface are significantly reduced. Therefore, when the strained MQW active layer is grown, undesired degradation of surface morphology is prevented, whereby the optical characteristics of the active layer are improved. Further, when this strained MQW active layer is included in a semiconductor laser, the laser characteristics are significantly improved.

Figure 4:
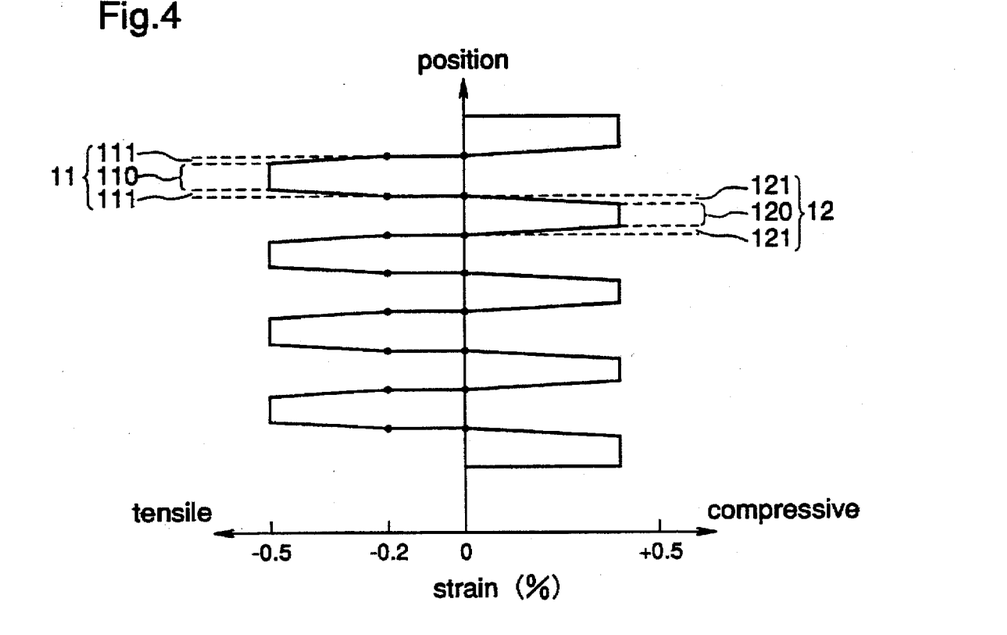
FIG. 4 is a diagram illustrating strains in a strained MQW active layer according to a modification of the first embodiment.
Figure 5:
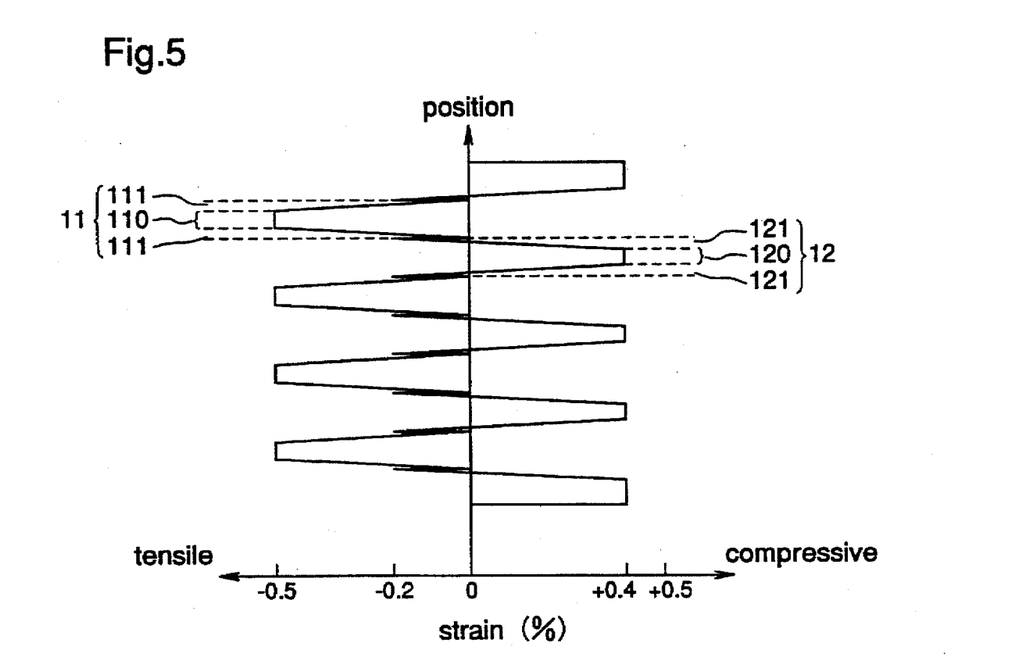
FIG. 5 is a diagram illustrating strains in a strained MQW active layer according to another modification of the first embodiment.

In the strained MQW structure shown in FIG. 4, at the interface between the well layer 11 and the barrier layer 12, the strain in the well layer 11 (−0.2%) is on the negative side, i.e., tensile side, from the strain in the barrier layer (0%). However, as long as the difference in strains between the well layer 11 and the barrier layer 12 at the interface of these layers is smaller than the difference in strains between the main regions 110 and 120 of these layers, the strain in the well layer 11 may be on the positive side, i.e., compressive side, from the strain in the barrier layer 12 at the interface. FIG. 5 shows an example of this case. In a strained MQW active layer shown in FIG. 5, each well layer 11 has transition regions 111 at both sides of a main region 110 and, in the transition regions 111, the strain gradually varies from −0.5% to 0% from the main region 110 toward the interfaces between this well layer 11 and adjacent barrier layers 12. On the other hand, each barrier layer 12 has transition regions 121 at both sides of a main region 120 and, in the transition regions 121, the strain gradually varies from +0.4% to −0.2% from the main region 120 toward the interfaces between this barrier layer 12 and adjacent well layers 11. In this strained MQW structure, the difference in strains between the well layer 11 and the barrier layer 12 at the interface of these layers is 0.2%, that is, smaller than the difference in strains between the main region 110 of the well layer 11 and the main region 120 of the barrier layer 12, i.e., 0.9%. Also in this case, lattice defects, such as dislocations, at the interface between the well layer 11 and the barrier layer 12 are reduced. Therefore, when the strained MQW active layer is grown, undesired degradation of surface morphology is prevented, whereby the optical characteristics of the active layer are improved. Further, when this strained MQW active layer is applied to a semiconductor laser, the laser characteristics are significantly improved.

[Embodiment 2]

Figure 6:
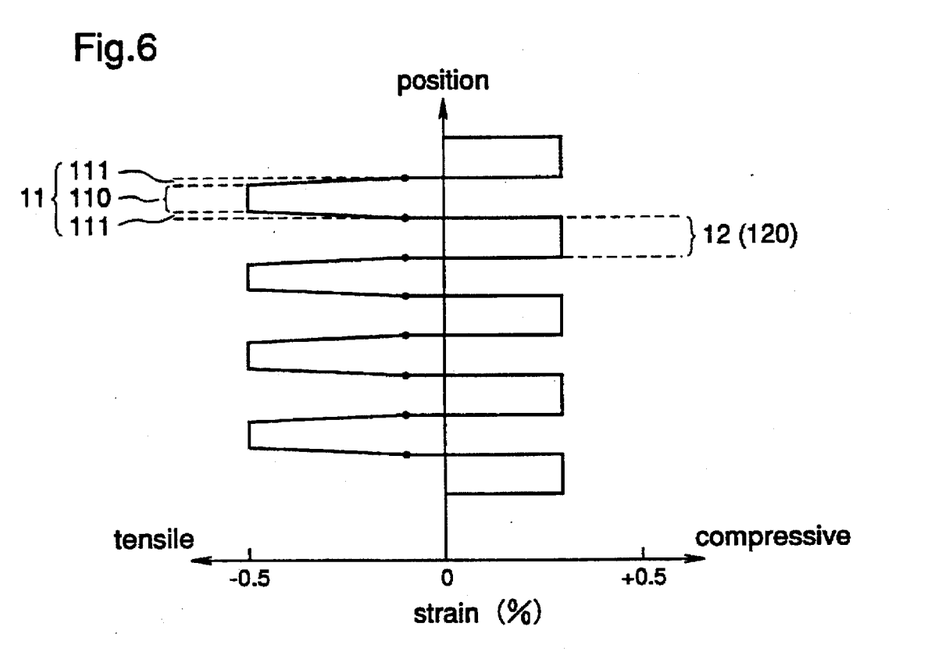
FIG. 6 is a diagram illustrating strains in a strained MQW active layer of a semiconductor laser device according to a second embodiment of the present invention.

FIG. 6 shows strains in a strained MQW active layer according to a second embodiment of the present invention. In the first embodiment of the invention, both the well layer 11 and the barrier layer 12 have the transition regions 111 and 121, respectively. However, as shown in FIG. 6, only the well layer 11 may have the transition regions 111, wherein the strain gradually varies from −0.5% to −0.1%, at both sides of the main region 110 whereas the barrier layer 12 comprises only the main region 120 having a uniform strain.

Also in this second embodiment of the invention, since the difference in strains between the well layer 11 and the barrier layer 12 at the interface of these layers is smaller than the difference in strains between the main region 110 of the well layer 11 and the main region 120 of the barrier layer 12, undesired lattice defects, such as dislocations, at this interface are reduced. Therefore, when the strained MQW active layer is grown, undesired degradation of surface morphology is prevented, whereby the optical characteristics of the active layer are improved. Further, when this strained MQW active layer is applied to a semiconductor laser, the laser characteristics are significantly improved.

[Embodiment 3]

Figure 7:
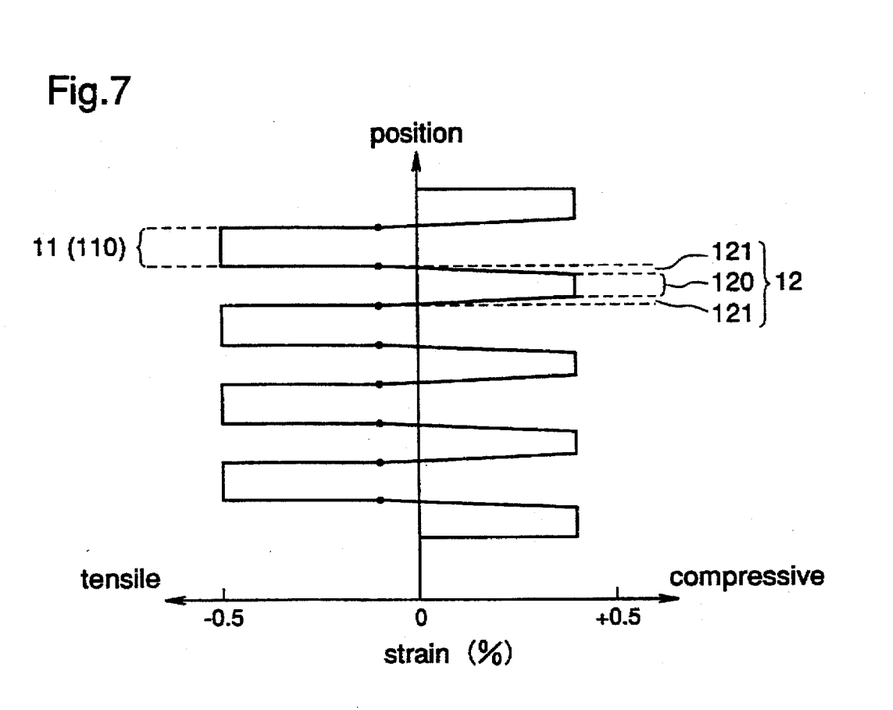
FIG. 7 is a diagram illustrating strains in a strained MQW active layer of a semiconductor laser device according to a third embodiment of the present invention.

FIG. 7 shows strains in a strained MQW active layer according to a third embodiment of the invention. Although in the second embodiment of the invention only the well layer 11 has the transition regions 111, in this third embodiment only the barrier layer 12 has the transition regions 121. More specifically, in the strained MQW active layer shown in FIG. 7, only the barrier layer 12 has the transition regions 121, wherein the strain gradually varies from +0.4 to −0.1%, at both sides of the main region 120 whereas the well layer 11 comprises the main region 110 having a uniform strain.

Also in this third embodiment of the invention, since the difference in strains between the well layer 11 and the barrier layer 12 at the interface of these layers is smaller than the difference in strains between the main region 110 of the well layer 11 and the main region 120 of the barrier layer 12, undesired lattice defects, such as dislocations, at this interface are reduced. Therefore, when the strained MQW active layer is grown, undesired degradation of surface morphology is prevented, whereby the optical characteristics of the active layer are improved. Further, when this strained MQW active layer is applied to a semiconductor laser, the laser characteristics are significantly improved.

[Embodiment 4]

Figure 8:
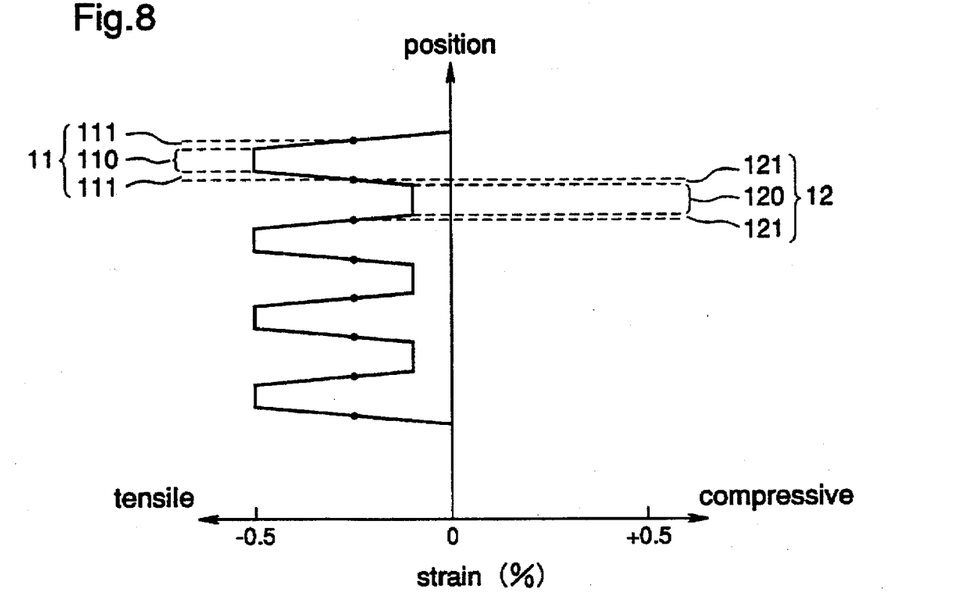
FIG. 8 is a diagram illustrating strains in a strained MQW active layer of a semiconductor laser device according to a fourth embodiment of the present invention.

FIG. 8 shows strains in a strained MQW active layer according to a fourth embodiment of the present invention. In the strained MQW active layers according to the first to third embodiments of the invention, the well layers 11 are tensively strained and the barrier layers 12 are compressively strained. However, both the well layers 11 and the barrier layers 12 may be tensively strained as long as the thickness of the strained MQW active layer 3 does not exceed a critical thickness at which defects, such as dislocations, occur. That is, in the strained MQW active layer according to this fourth embodiment, as shown in FIG. 8, each well layer 11 comprises a main region 110 having a tensile strain of −0.5% and transition regions 111 wherein the strain gradually decreases from the main region 110 toward the adjacent barrier layers 12, and each barrier layer 12 comprises a main region 120 having a tensile strain of −0.1% and transition regions 121 wherein the strain gradually increases from the main region 120 toward the adjacent well layers 11, so that the difference in strains between the well layer 11 and the barrier layer 12 at the interface of these layers is zero. In addition, the strained MQW active layer 3 is thinner than the critical thickness.

Also in this fourth embodiment of the invention, since the difference in strains between the well layer 11 and the barrier layer 12 at the interface of these layers is smaller than the difference in strains between the main region 110 of the well layer 11 and the main region 120 of the barrier layer 12, undesired lattice defects, such as dislocations, at this interface are reduced. Therefore, when the strained MQW active layer is grown, undesired degradation of surface morphology is prevented, whereby the optical characteristics of the active layer are improved. Further, when this strained MQW active layer is applied to a semiconductor laser, the laser characteristics are significantly improved.

Figure 9:
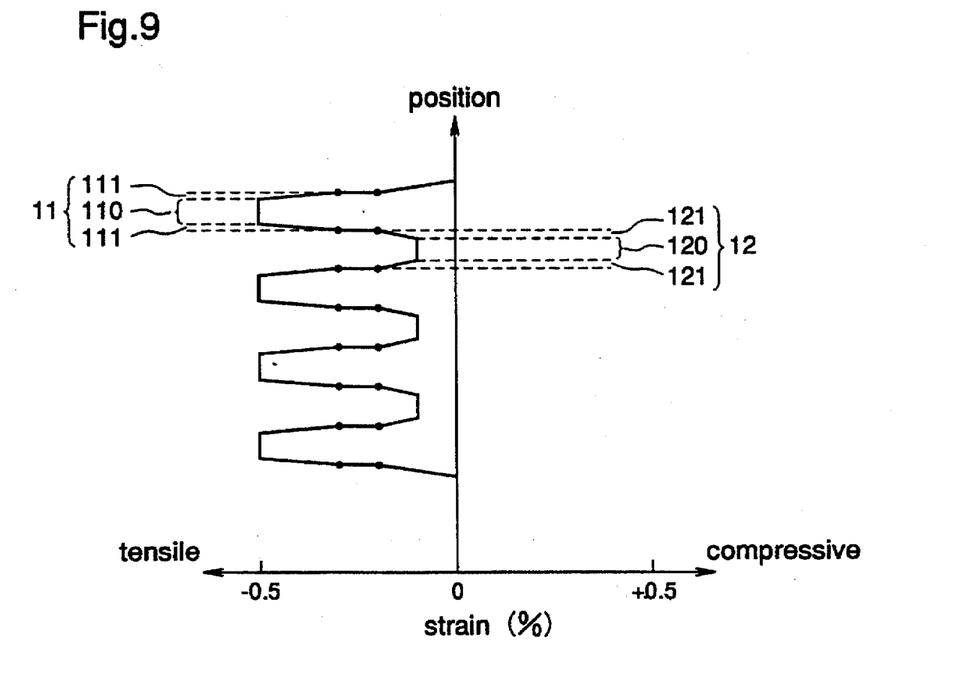
FIG. 9 is a diagram illustrating strains in a strained MQW active layer according to a modification of the fourth embodiment.

While in this fourth embodiment the difference in strains between the well layer 11 and the barrier layer 12 at the interface is zero, there may be a little difference in strains between these layers at the interface, as shown in FIG. 9.

Even in this case, as long as the difference in strains between the well layer 11 and the barrier layer 12 at the interface is smaller than the difference in strains between the main region 110 of the well layer 11 and the main region 120 of the barrier layer 12, undesired lattice defects, such as dislocations, at this interface are reduced, and the same effects as provided by the fourth embodiment are achieved.

[Embodiment 5]

In the strained MQW active layers according to the first to third embodiments of the invention, the well layers 11 are tensively strained and the barrier layers 12 are compressively strained. However, in contrast to these strained MQW active layers, a strained MQW active layer according to this fifth embodiment comprises compressively strained well layers and tensively strained barrier layers, as in the prior art semiconductor laser disclosed in Japanese Published Patent Application No. Hei. 6-224516.

In this publication, it is described that a high quality MQW active layer is grown when the well layers are compressively strained and the barrier layers are tensively strained to reduce the compressive strains in the well layers. However, the difference in strains between the well layer and the barrier layer is 1.0% in this publication, and such a large difference in strains causes lattice defects, such as dislocations, at the interface of the well layer and the barrier layer. So, in fact, it is very difficult to grow a strained MQW active layer with a high crystalline quality.

Figure 10:
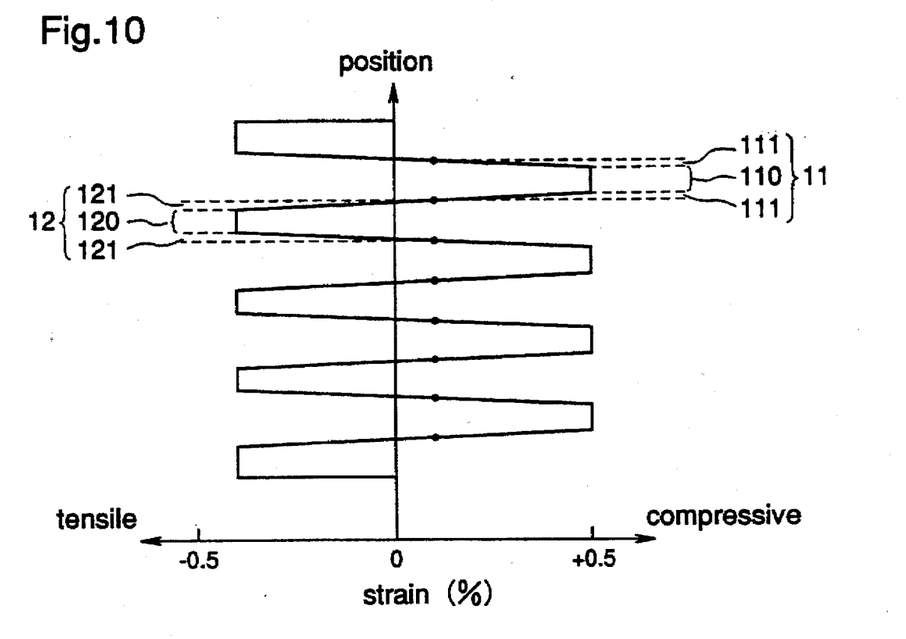
FIG. 10 is a diagram illustrating strains in a strained MQW active layer of a semiconductor laser device according to a fifth embodiment of the present invention.

FIG. 10 shows strains in the strained MQW active layer according to this fifth embodiment of the invention. In the strained MQW active layer, each well layer 11 includes a main region 110 comprising $Ga_{0.448}In_{0.552}P$ and each barrier layer 12 includes a main region 120 comprising $(Al_{0.5}Ga_{0.5})_{0.548}In_{0.452}P$. The main region 110 of the well layer 11 has a compressive strain of 0.5%, i.e., +0.5% with respect to the GaAs substrate 1, and the main region 120 of the barrier layer 12 has a tensile strain of 0.4%, i.e., −0.4% with respect to the GaAs substrate 1, because of the lattice mismatch with the GaAs substrate 1. That is, the difference in strains between the main region 110 of the well layer 11 and the main region 120 of the barrier layer 12 is 0.9%.

Further, each well layer 11 has transition regions 111 comprising GaInP several angstroms thick at both sides of the main region 110 toward the interfaces between this layer and the adjacent barrier layers 12. In each transition region 111, the composition of GaInP gradually varies from $Ga_{0.448}In_{0.552}P$ to $Ga_{0.488}In_{0.512}P$ so that the strain gradually varies from +0.5% to +0.1% from the main region 110 toward the interface.

On the other hand, each barrier layer 12 has transition regions 121 comprising AlGaInP several angstroms thick at both sides of the main region 120 toward the interfaces between this layer and the adjacent well layers 11. In each transition region 121, the composition of AlGaInP gradually varies from $(Al_{0.5}Ga_{0.5})_{0.548}In_{0.452}P$ to $(Al_{0.5}Ga_{0.5})_{0.488}In_{0.512}P$ so that the strain gradually varies from −0.4% to +0.1% from the main region 120 toward the interface. In the strained MQW active layer, both the well layer 11 and the barrier layer 12 have the same strain, i.e., +0.1%, at the interface between these layers. That is, the difference in strains between the well layer and the barrier layer at the interface is zero.

According to this fifth embodiment of the invention, since the difference in strains, i.e., lattice constants, between the compressively strained well layer 11 and the tensively strained barrier layer 12 at the interface of these layers is reduced, lattice defects, such as dislocations, at the interface are significantly reduced. So, the strained MQW active layer is grown with improved surface morphology, whereby the optical characteristics of the active layer are significantly improved. Further, when this strained MQW active layer is applied to a semiconductor laser, the laser characteristics are significantly improved.

[Embodiment 6]

Figure 11:
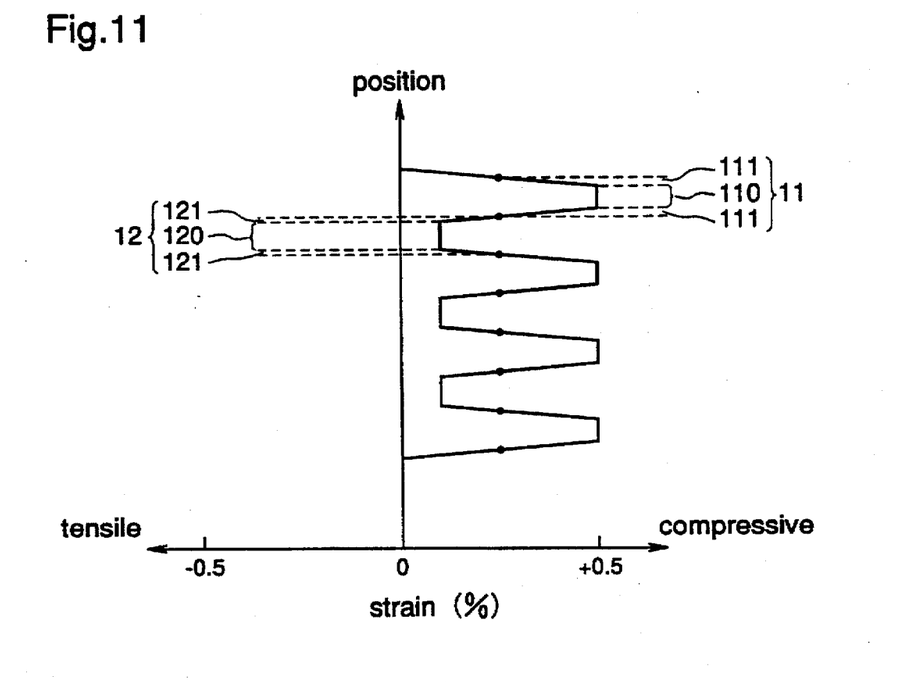
FIG. 11 is a diagram illustrating strains in a strained MQW active layer of a semiconductor laser device according to a sixth embodiment of the present invention.

FIG. 11 shows strains in a strained MQW active layer according to a sixth embodiment of the present invention. In the strained MQW active layer according to the fifth embodiment of the invention, the well layer 11 is compressively strained and the barrier layer 12 is tensively strained. However, both the well layer 11 and the barrier layer 12 may be compressively strained as long as the thickness of the strained MQW active layer 3 does not exceed a critical thickness at which defects, such as dislocations, occur. That is, in the strained MQW active layer according to this sixth embodiment, as shown in FIG. 11, each well layer 11 comprises a main region 110 having a compressive strain of +0.5% and transition regions 111 wherein the strain gradually decreases from the main region 110 toward the adjacent barrier layers 12, and each barrier layer 12 comprises a main region 120 having a compressive strain of +0.1% and transition regions 121 wherein the strain gradually increases from the main region 120 toward the adjacent well layers 11, so that the difference in strains between the well layer 11 and the barrier layer 12 at the interface of these layers is zero. In addition, the strained MQW active layer 3 is thinner than the critical thickness.

Also in this sixth embodiment of the invention, since the difference in strains between the well layer 11 and the barrier layer 12 at the interface of these layers is smaller than the difference in strains between the main region 110 of the well layer 11 and the main region 120 of the barrier layer 12, undesired lattice defects, such as dislocations, at this interface are reduced. Therefore, when the strained MQW active layer is grown, undesired degradation of surface morphology is prevented, whereby the optical characteristics of the active layer are improved. Further, when this strained MQW active layer is applied to a semiconductor laser, the laser characteristics are significantly improved.

Figure 12:
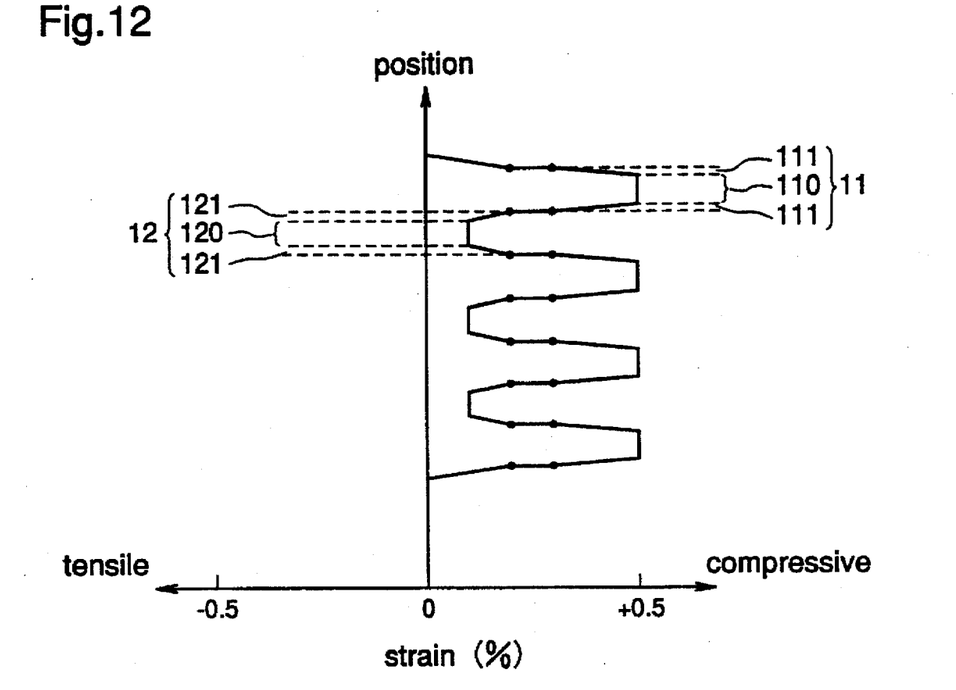
FIG. 12 is a diagram illustrating strains in a strained MQW active layer according to a modification of the sixth embodiment.

While in this sixth embodiment the difference in strains between the well layer 11 and the barrier layer 12 at the interface is zero, there may be a little difference in strains between these layers at the interface, as shown in FIG. 12. Even in this case, as long as the difference in strains between the well layer 11 and the barrier layer 12 at the interface is smaller than the difference in strains between the main region 110 of the well layer 11 and the main region 120 of the barrier layer 12, undesired lattice defects, such as dislocations, at this interface are reduced, and the same effects as provided by the sixth embodiment are achieved.

What is claimed is:

1. A semiconductor laser device comprising:

a strained multiquantum well active layer including a plurality of well layers and a plurality of barrier layers, alternatingly laminated, each well layer including a main region having a strain and each barrier layer including a main region having a strain different from the strain of the well layer, wherein at least one of each of the well layers and each of the barrier layers has transition regions at both sides of the main region, the transition regions having a strain that gradually varies from the strain of the adjacent main region to the strain of the main regions of adjacent layers toward interfaces between the well and barrier layers, and strain difference between adjacent well and barrier layers at interfaces of the well and barrier layers is smaller than strain difference between the main regions of the adjacent well and barrier layers.

2. The semiconductor laser of claim 1 wherein both the well layers and barrier layers include the transition regions.

3. The semiconductor laser of claim 1 wherein the well layers include the transition regions, and the barrier layers comprise only the main regions.

4. The semiconductor laser of claim 1 wherein the barrier layers include the transition regions, and the well layers comprise only the main regions.

5. The semiconductor laser of claim 1 wherein the strain in the main region of each well layer is a tensile strain, and the strain in the main region of each barrier layer is a compressive strain.

6. The semiconductor laser of claim 1 wherein the strain in the main region of each well layer is a tensile strain, and the strain in the main region of each barrier layer is a tensile strain.

7. The semiconductor laser of claim 1 wherein the strain in the main region of each well layer is a compressive strain, and the strain in the main region of each barrier layer is a tensile strain.

8. The semiconductor laser of claim 1 wherein the strain in the main region of each well layer is a compressive strain, and the strain in the main region of each barrier layer is a compressive strain.

* * * * *